United States Patent [19]
d'Auria

[11] 3,991,401
[45] Nov. 9, 1976

[54] METHOD OF RECOGNIZING WORDS FOR AN ASSOCIATIVE STORE AND AN OPTICAL DEVICE FOR IMPLEMENTING SAID METHOD

[75] Inventor: Luigi d'Auria, Paris, France
[73] Assignee: Thomson-CSF, Paris, France
[22] Filed: Apr. 11, 1975
[21] Appl. No.: 567,405

[30] Foreign Application Priority Data
Apr. 16, 1974 France .............................. 74.13204

[52] U.S. Cl. .................. 340/146.3 P; 340/173 AM; 340/173 LM; 350/DIG. 1
[51] Int. Cl.²......................................... G11C 15/00
[58] Field of Search ............... 340/173 LT, 173 LM, 340/173 AM, 146.3 P; 350/DIG. 1, 3.5, 162 SF

[56] References Cited
UNITED STATES PATENTS

| 3,614,191 | 10/1971 | Sakaguchi et al............ | 340/173 LM |
| 3,720,453 | 3/1973 | Lee et al...................... | 340/173 LM |
| 3,781,830 | 12/1973 | Vilkomerson................ | 340/173 LM |
| 3,887,906 | 6/1975 | Minnaja....................... | 340/173 LM |

OTHER PUBLICATIONS
Sakaguchi et al., "A New Associative Memory System Utilizing Holography," IEEE Transactions On Computers, vol. C-19, No. 12, 12/70, pp. 1174-1181.
Gabor, "Associative Holographic Memories," IBM J. Res. Develop., Mar. 1969, pp. 156-159.
Cobb et al., "Associatively Addressed Holographic Storage," IBM Tech. Disclosure Bulletin, vol. 13, No. 5, 10/70, pp. 1070-1071.

*Primary Examiner*—Leo H. Boudreau
*Attorney, Agent, or Firm*—Cushman, Darby & Cushman

[57] ABSTRACT

The invention provides a method for simultaneously identifying the location of all those words which, in a page store, are identical to a key word. The words of a page exhibiting at least the same 1 value as the keyboard are classified in a first set, and those exhibiting at least the same 0 value, in a second set, the identified words being those belonging to both sets. The invention also describes two embodiments of an optical device for implementing the method in an associative optical store; in both embodiments, two identical images of the page store are respectively projected onto two detection planes constituted by detection rows, through two modulation plane constituted by modulating columns.

16 Claims, 4 Drawing Figures

3,991,401

METHOD OF RECOGNIZING WORDS FOR AN ASSOCIATIVE STORE AND AN OPTICAL DEVICE FOR IMPLEMENTING SAID METHOD

FIELD OF THE INVENTION

The present invention relates to associative optical stores.

Those skilled in the art will be aware that an associative store makes it possible to recognise, amongst a large number of stored words which are generally present in binary form, those which, in part or in whole, are identical to a given word known as the "key word," and also to pinpoint the location of these words in the store. A store of this kind can make it possible, for example, in a stored card index to identify those cards which contain one or more special characteristics (for example persons living in the same area in a card index of addresses, or the frequency of a word in a text); it can also be used to identify the adresses of words stored in a storage plane.

BACKGROUND OF THE INVENTION

In conventional associative stores, the searching operation carried out to determine the position of the recorded words, is carried our by an operation of sequential interrogation; the interrogation time is therefore necessarily lengthy, the more so indeed the larger the capacity of the store.

Optical stores and in particular holographic stores, combine a high storage capacity with the possibility of parallel read-out, in other words simultaneous and therefore fast read-out, of the recorded words.

D. Gabor, in an article entitled "Associative holographic memories," (IBM J. Res. Develop.March 1969), proposed that the principles utilised in holographic correlators in order to achieve the simultaneous identification of the words contained in a store page recorded by holographic method, should be used. It is well known, in other words, that if the interference patterns produced by two coherent light beams A and B which may each contain information in binary form, are recorded, and that if the resulting hologram is read out using a coherent light beam $A_1$, the beam B will reconstitute the information which it contains, in the form of an auto-correlation signal, with a density which is the higher the closer the information contained in the beam $A_1$ is to that contained in the beam A.

An associative store system which is not very different from this, has been put forward by SAKAGUCHI et.al. in "A new associative memory system utilising holography" (IEEE Trans. on computers. Vol. C, 19. No. 12, Dec. 1970). The coherent beams A and B, respectively associated with two sets of binary words $a_j$ and $b_j$, make it possible to record the holograms forming a store page, line by line; a line of order $j$ simultaneously incorporates the information relating to a word $a_j$ and that relating to a word $b_j$, in the form of as many separate holograms, all comprising the bits of $b_j$, as there are bits in $a_j$; each hologram occupies in the line or row, one or the other of two distinct positions depending upon whether the bit $a_j$ with which it is associated has the value 0 or 1, the bits of $a_i$ thus being coded by position of their associated hologram. At the time of read-out, a coherent beam $A_l$ projects on to the hologram page thus obtained, a set of spots, each spot coinciding in each line or row, with one or the other of the two possible positions of each recorded hologram; all lines of the spots are identical, each containing one and the same key word $A_l$, coded in the form of its binary complement by the position of the spots in the line. Any hologram coinciding with a spot, will reconstitute the word $b_j$ which has been used to record it. Thus, in a line where the recorded word $a_i$ differs by $p$ of its bits, from the key word $a_1$, the complement $\overline{a_i}$ of $a_i$ is projected in the form of a line of spots $p$ of which coincide with the recorded holograms; the line therefore reconstitutes $p$ superimposed images of the word $b_i$ associated with the word $a_i$. By contrast, if $a_j$ is identical to $a_l$ and therefore differs completely from $\overline{a_l}$, no spot in the projected line coincides with a hologram of the line $j$, and no image of $b_j$ is reconstituted, making it possible, therefore, to identify in the store page the positions of those words $a_j$ which are identical to the key word $a_1$.

The afore described systems present a double disadvantage. The different words in the holographic storage plane must be recorded successively and this complicates the procedure of recording. Each bit has to be recorded both directly and in the forms of its complement, and this divides the store density by two.

SUMMARY OF THE INVENTION

The method of word recognition in an associative store and the device implementing said method, which forms the object of the present invention, makes it possible to overcome the two above mentioned drawbacks of the prior art. The store planes utilised by the method and device described hereinafter contain the binary information in an optically recorded form, the recording having been effected either directly or by a holographic procedure, and when lighted by a luminous read-out beam, restore the recording in the form of light spots projected simultaneously on the two identical regular arrays of photodectors which perform the read-out function. Due to this double read-out, each bit in the store plane can be recorded without its complement, the value 1 corresponding to the presence of a light spot, and the value 0 to the absence of a light spot. If the store plane is holographic in nature, the invention makes it possible to use a conventional holographic plane, produced in accordance with a prior art technique by regular array of successively recorded holograms, each corresponding to a complete page of words.

BRIEF DESCRIPTION OF THE DRAWING

The invention together with its features, advantages and objects, can be better understood from the following detailed description when read in conjunction with the attached drawing in which.

DESCRIPTION OF THE PREFERRED EMBODIMENTS

Figure 1:
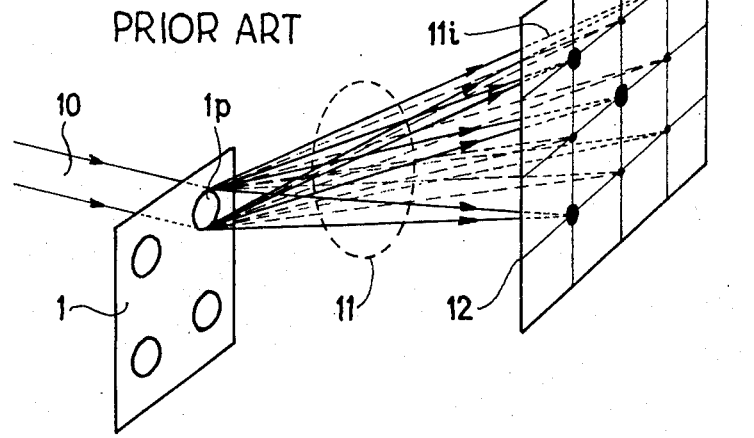
FIG. 1 is an explanatory diagram pertaining to the operation of holographic store plane of prior art type.

FIG. 1 is an explanatory figure illustrating the operation of a holographic store plane of prior art design.

The store plane 1 will for example be a photographic plate upon which there have been recorded a certain number of holograms such as $1_p$, this in form of the variations in the transparency of the emulsion; these holograms are regularly arranged upon the plate in the form of a regular array, and each of them is the hologram of a page of the store. A coherent light beam 10 makes it possible to illuminate one or the other of these holograms. Each hologram, when illuminated by the beam 10, transforms the latter into a set 11 of convergent beams such as 11$i$; whatever the hologram, all the beams converge in a same plane 12 where they project the image of the page recorded by the corresponding hologram, in the form of a set of light spots such as 12$i$, the latter being the point of convergence of the beam 11$i$. These light spots, on the plane 12, occupy a certain number of nodes of an array of M rows and N columns, and, in binary notation, indicate the presence of a 1 bit; the nodes of the array at which there is no light spot correspond to 0 bits.

By displacing the beam 10 in order to illuminate a selected hologram of the store plane 1, the page whose image is projected on to the plane 12 is selected. The images of the different pages are projected in accordance with the nodes of a same array, so that they can be read out by an array of photodetectors arranged at a fixed position in the plane 12.

In the example shown in FIG. 1, this having been deliberately simplified in order to facilitate illustration, the store plane 1 comprises an array of four holograms corresponding to four store pages. The image of each page forms an array of three rows and three columns; each row represents a coded binary word, the store page thus comprising three words of three bits each, respectively working from top to bottom (101), (010) and (100).

In practice, the information density of the holographic store planes may be much higher, for example, in each plane, around a thousand holograms comprising 30 words of 30 bits each.

The invention proposes a method of recognizing words, which is applicable to an associative store and which makes it possible to utilize without modification, any conventional optical store plane similar to that described in FIG. 1. To illustrate this procedure, it will be applied to the store plane illustrated by said same figure.

Thus, there is a store page containing M words of N bits each (for example the three-bit words 101, 010 and 100, projected on to the plane 12 of FIG. 1) amongst which it is desired to identify words which are identical to a key word also comprising N bits, the word 100 for example.

To this end, in each page, two sets respectively defined the first set as the one containing the words which incorporate at least the same 1 values as the given word, and the second set as the one containing the same 0 values, are formed. Thus, for three-bit words, the key word being 100, the first set may contain one or the other of the words 100, 101, 110 and 111, the second 100 and 000; in the selected page, the words 100 and 101 will be classified in the first set and the word 100 in the second (it will be seen that words such as 010 may not be classified in either of the two sets). The words, if they exist, which belong simultaneously to the two sets (in the present case, the word 100) are thus identified as being identical to the key word.

The classification of the words in each page as belonging or not belonging, respectively to the first and second sets, is carried out simultaneously on first and second identical images of the same page.

To do this, with each bit of each image there can be associated a logic signal which acquires a value $s_l$ in respect of bits of value 1, and $s_0$, which is less than $s_l$, in respect of bits of value 0. Thus, the regular array arrangement of the words in the page is exploited in order to arrange that the only bits truly associated with signals, are those located in the same columns as the bits of value 1 of the key word, in the case of the first image, and as the bits of value 0 in the case of the second image.

All the signals coming from the bits of a same word, and therefore from a same row, are added in order to furnish a row signal $S_i{}^1$ for the first image, and a row signal $S_j{}^0$ for the second image, characteristic of each word in each image. Each of these signals is compared with a single threshold value for each image, $S_S{}^1$ in the case of the first, $S_S{}^0$ in the case of the second; these two threshold values are linear functions of the numbers of bits having the values 1 and 0, which the key word contains. All the words which in the first image result in a signal $S_i{}^1$ which is in excess of the threshold value $S_S{}^1$, are classified in the first set and all the words which in the second image result in a row signal $S_j{}^0$ which is less than the threshold value $S_j{}^0$, are classified in the second set.

By continuing to apply the above described method to the same example, it will be seen that in the case of the first image, signals are only associated with the bits located in the first column, which is the only one in which the three bits of the key word 100 exhibit the value 1. To simplify matters, it will be assumed in the following that the signal associated with the value 0, namely $s_0$, has a zero value; the words of the first, second and third rows, respectively 101, 010 and 100, then furnish row signals $S_1{}^1 = s_1$, $S_2{}^1 = 0$, $S_3{}^1 = s_1$.

In order to select words which, like the key word, contain a 1 in the first column, it is merely necessary to retain those whose row signal exceeds the threshold value $S_S{}^1 = 0$, namely the words 100 of the first row and 101 of the third. Similarly, in respect of the key words comprising two 1 bits, such as 011, 101 or 110, the threshold value would be $S_S{}^1 = S_S{}^1 = s_1$, and in the case of the word containing three 1 bits, namely 111, it would be $S_S{}^1 = 2s_1$.

In a general way, for an N-bit word containing $P_1$ times the value 1, the condition $S_S{}^1 = (P_1 - 1) s_1$ applies.

As now concerns the second image, associated with identification of 0 bits, only those signals located in the same columns as the 0 values of the key word, in other words the second and third columns, are picked off; the words 101 of the first row and 010 of the second row, furnish row signals $S_1{}^0$ and $S_2{}^0$, both of which have the value $s_1$, and the word 100 of the third row, furnishes a signal $S_3{}^0$ of value zero. The identification of words which, like the key word, contain 0 in the second and third columns, is carried out by taking only those whose row signal is less than the threshold value $S_S{}^0 = s_1$; in the present example this is the case with the single word 100 which therefore on its own form the second set. In a more general manner and in the particular case where the value of $s_0$ is zero, the threshold value $S_S{}^0$ which is characteristic of the second set, will have a constant value of $s_1$, whatever the number of bits and the composition of the key word; it will be shown at a later point that this threshold value $S_S{}^0$ is no longer constant when the signal $s_0$ is other than zero.

It will be seen that the method has made it possible to classify the three words 101, 010 and 100 of the page into two sets the first of which comprises 101 and 100, and the second 100, and that the only word common to the two sets is the word appearing in the second row, namely 100, which indeed is identical with the key word.

The method as above described is applicable equally in a situation where the key word has a number P of bits, less than the number N of bits contained in each of the M words of the array; then, the task is to recognise words which contain the key word, for example, among the three words 101, 010 and 100 of the preceding example, those which contain the word 10. It is in this case, merely necessary to arrange that, simultaneously in both images, there is no signal produced from the (N − P) columns corresponding to the (n − P) non indicated bits of the key word, in fact the third column in the selected example; the words 101 and 100 thus form part of the first and of the second set, and, as such, are identified as those two words in the page which contain the key word 10.

FIRST EMBODIMENT

Figure 2:
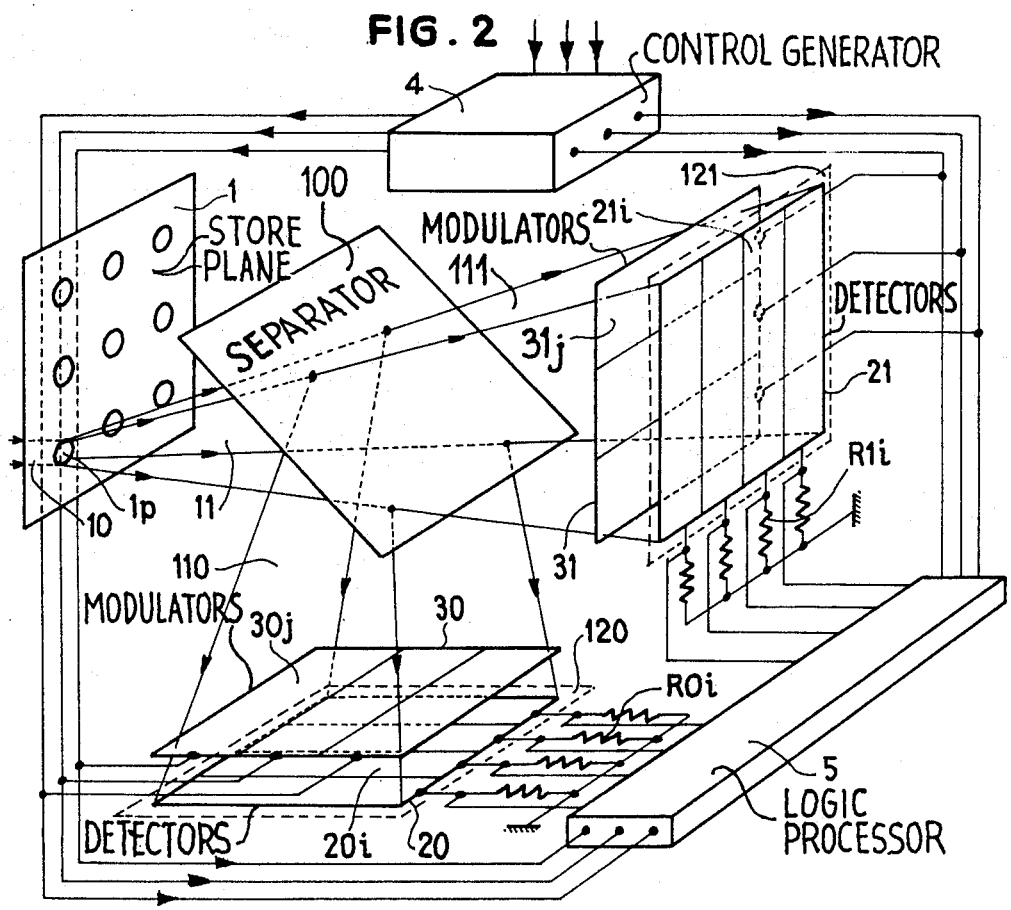
FIG. 2 illustrates a first embodiment of the device in accordance with the invention.

FIG. 2 illustrates a first embodiment of the device in accordance with the invention, implementing the aforedescribed recognition method.

It will be seen from a consideration of this figure, that there are optical projection means comprising, like the device shown in FIG. 1, a store plane 1 where a regular array of holograms such as that lp, is recorded, a mobile laser beam 10 illuminating one or the other of said holograms in order to form the assembly 11 of convergent beams projecting onto a same plane, as shown in FIG. 1, in the form of a set of light spots corresponding bits of value 1, the image of the page recorded in the hologram. In contradistinction to the device shown in FIG. 1, these optical projection means comprise, furthermore, a semi-transparent separator plate 100 arranged in the path of the assembly of beams 11 and dividing them into two sub-assemblies of beams, one, 110, being reflected and the other, 111, being transmitted by the plate; in this fashion, two identical images of the recorded page are obtained, respectively located in the planes 120 and 121 which are symmetrical in relation to the plane of the separator plate 100.

In the planes 120 and 121, detection means 20 and 21 are arranged; they are formed by two flat sets of M linear photodetectors such as those 20i and 21i.

Each linear photodetector, constituted by a continuous strip of photo-conductive material, is designed to receive a row of bits of the image of the projected page, and therefore a word contained by the page; it injects into a resistor such as that R0i or R1i, and thus produces a row of voltage $V_i^0$ or $V_i^1$. All the resistors R0i and R1i have an identical resistance R.

Between the plate 12 and the detection means 20 and 21, modulating means 30 and 31 are arranged; each of them is formed by a flat assembly of N modulating bars, such as those 30j and 31j, each bar having an input which enables it to be supplied with a control volage $E_j$. Although FIG. 2 shows these bars as being clearly separated from the detection means, this in order to facilitate understanding of the drawing, the modulating planes are in fact virtually contiguous with the detection planes 20 and 21; the bars which form as many columns, are arranged perpendicularly to the linear photodetectors 20i or 21i and are therefore disposed parallel to the columns of the array constituting the image page. The N columns of modulating means thus delimit N distinct zones; on each linear detector of the associated detection plane, each zone being associated with a bit in the word projected on to the row.

These modulating bars are designed upon the lines of conventional electro-optical modulators, utilising for example the longitudinal electro-optical effect or Pockels effect; they are constituted, therefore, by a thin plate of a material such as deuterium monopotassium phosphate (KDP) or calcite, covered, on both the faces perpendicular to the direction of propagation of the light, by two transparent electrodes, and are arranged between crossed polarizer and analyser. In the absence of any applied field, the crystal is unixial, the optical axis being directed in accordance with the direction of propagation of the light, and the resultant modulator system is opaque. In the presence of an applied field, the crystal becomes biaxial; if the polarizers are orientated at 45° to the two preferred directions of propagation of the crystal, it is then merely necessary to apply to the electrodes a voltage such that the plate produces a phase difference equal to half the illuminating wavelength; the light is rotated through 90° on passing across the plate and is then transmitted by the output polarizer; the modulator is then transparent. Each column of the modulating means, controlled by a logic signal, is thus transparent if a logical signal of value 1 is applied to it, and opaque if a logic signal of value 2 is applied to it.

It is also possible to utilise by way of modulating material, a thin film of liquid crystal. However, the responsive time of the modulator is then considerably lengthened.

The device shown in FIG. 2 likewise comprises a control generator 4 which has N inputs for receiving the P bits composing the key words, and 2N outputs for simultaneously furnishing the control voltages $E_j^0$ and $E_j^1$ for the 2N modulator bars; the device of FIG. 2 also comprises logic processing means 5 designed to process the row voltages, these means incorporating 2M inputs to which to apply the row voltages $V_i^0$ and $V_i^1$, and making it possible to recognise the location of the words which are being sought.

Figure 3:
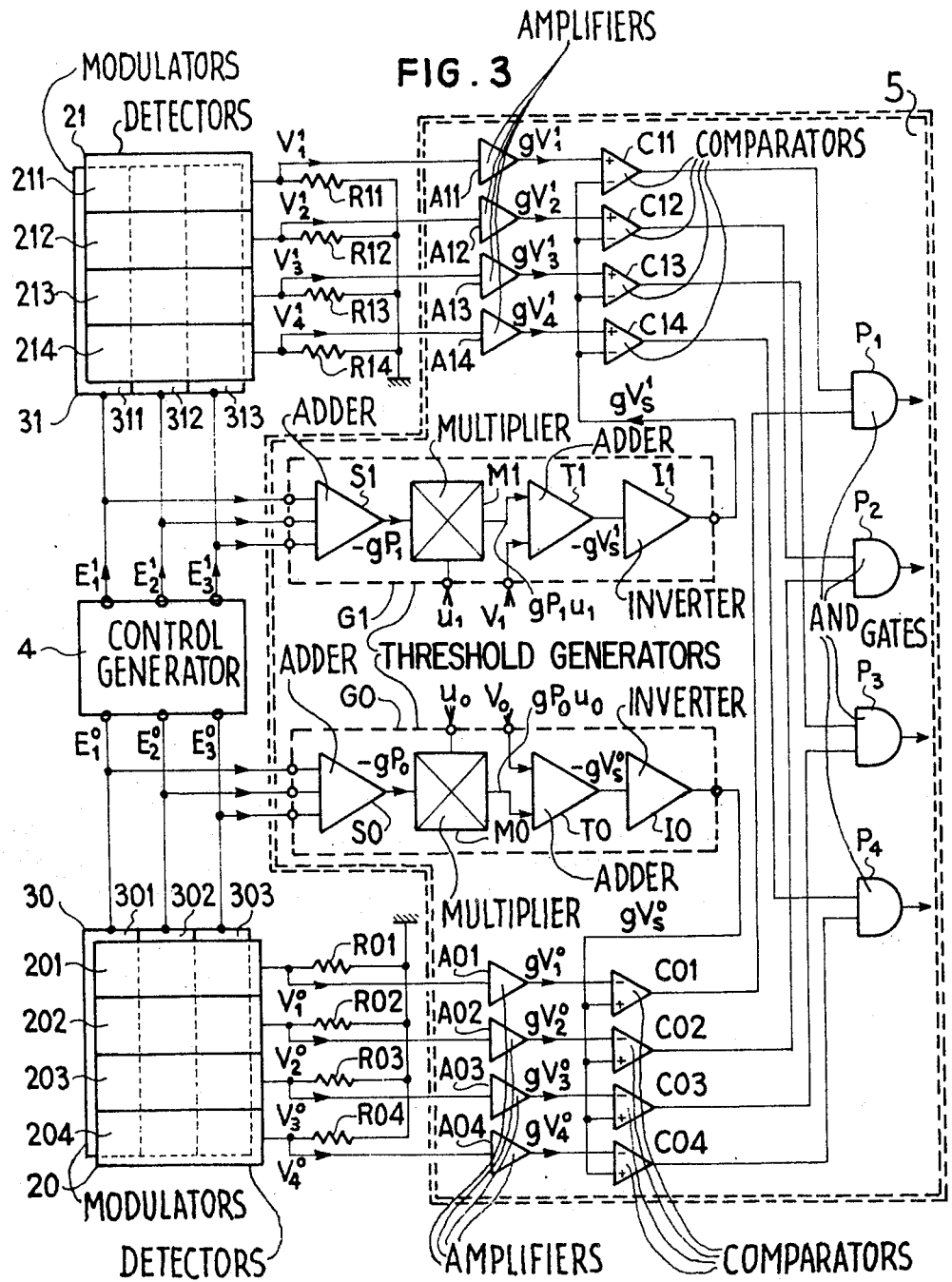
FIG. 3 illustrates the organisation of the logic processing of the signals, in accordance with the invention.

The detailed diagram of the logic processing means used to process the row voltages, and of the connections between these means and the control generator 4, the detection means 20 and 21 and the modulating means 30 and 31, has been illustrated in FIG. 3.

As FIG. 3 shows, the means used to process the row voltages are essentially constituted by the threshold generators G0 and G1, two groups of M comparators each, $C0_i$ and $C1_i$, and a group of M AND-gates Pi with two inputs and one output.

Each threshold generator G0 or G1 comprises N inputs designed to be supplied, from the control generator 4, with the N control voltages which are also applied to the N respective inputs of the modulating means 30 and 31, and also comprises two supplementary inputs respectively to receive a multiplier signal $U_o$ or $U_1$ and a voltage Vo or V1 T1, a multiplier M0 or M1 and a polarity inverter I0 or I1 and furnishes at a single output, a threshhold voltage which is a linear function of the sum of the control voltages applied to the input: $S_s^0$ in the case of the generator G0 and $S_s^1$ in the case of the generator G1.

Each comparator $C0_i$ and $C1_i$ is associated with a linear detector 20i or 21i in the corresponding detection plane. At one of its inputs, it is supplied with the row voltage $g V_i^0$ or $gV_i^1$ coming from the particular row throught the medium of an amplifier A0i or A1i, all the amplifiers having the same gain g; at the other input, it is supplied with the threshold voltage $gV_s^0$ for the comparators of the group C0, and with that $gV_s^1$ for those of the group C1. It furnishes an output logic signal which is a function of the comparison effected between these two voltages.

Each gate Pi has two inputs designed to receive the logic signals, respectively from the comparators $C0_i$ and $C1_i$, these signals therefore being associated with rows of the same order in the two detection planes 20 and 21. It produces a logic signal which characterizes the word recorded in the relevant row of the store page; this signal has the logic value 1, if the two input logic signals also have the value 1, and the value 0 if the contrary is the case.

The device shown in FIGS. 2 and 3 operates in the following manner:

The two detection planes 120 and 121 are supplied with two identical images. The plane 120 is designed to identify words which exhibit at least the same 0 values as the key word, and the plane 121 is designed to identify words exhibiting at least the same 1 values.

The control generator 4 is supplied with the key word. As a function of the composition of the latter, it simultaneously generates two groups of N logic control signals each, designed in the one case to identify the 1 values, and in the other the 0 values.

As far as the identification of the 1 values is concerned, the device operates in the following way. Each column of modulating means 31 is associated, through the control generator, with a bit in the key word, the first column being associated with the first bit, the second with the second, etc.., etc. The first group of N control signals $E_j^1$ simultaneously applied to the N modulating columns $32_j$, reproduces the P bits of the key word: with the 1 values of the key word there are associated control signals of logic values 1 which produce transparency in the corresponding modulating columns, and with the 0 values in the key word there are associated logic values 0 which leave the modulating columns opaque; the modulating columns are also opaque in respect of the (N - P) non indicated bits of the key words.

Thus, due to the action of the modulating means 31, each linear detector 21i in the detection plane 21, receives light signals only in respect of the 1 values of the corresponding word, which are located in the same columns as the 1 values of the key word, since the light signals corresponding to the 1 values of the word, which are located in the same columns as the 0 values, or in other words the non-indicated bits of the key words, are intercepted by the modulating means. If we assume, by way of a simplifying hypothesis, on the one hand that the bars supplied with the control voltage of logic value 0, are perfectly opaque, and that on the other hand the non-illuminated zones of the linear detectors produce zero current, then the maximum current furnished by a linear detector 21i will be equal to $P_1i_1$, $P_1$ being the number of bits of value 1 contained on the key word, and $i_1$ the current furnished by an illuminated zone; the corresponding row voltage is then given by:

$$(V_i^1)_M = RP_1i_1$$

where R is the common resistance of the resistors R0i and R1i. This row voltage characterizes all the words belonging to the first set or the set of words exhibiting at least the same as 1 values as the key word.

The row voltage whose value is closest, corresponds to words in respect of which a 0 is substituted for a 1 in a single transparent column; this voltage can therefore be taken as the threshold voltage $V_s^1$:

$$V_s^1 = R(P_1 - 1) i_1$$

The threshold generator G1 is supplied with the first group of N control signals $E_1^1$, which are also supplied to the modulating means 31. From a signal $gP_1$ proportional to the number $P_1$ of logic signals having the value 1 which are contained in the group of N signals, it furnishes a reference voltage $gV_s^1$ to the M comparators C1i which receive said voltage at their "minus" inputs.

The comparators C1i are also supplied, at their "plus" inputs, via the amplifiers $A1_i$, with the row voltage $gV_i^1$ coming from the corresponding linear photodetector 21i. They emit a logic 1 signal in respect of all the $V_i^1$ signals which exceed the threshold $V_s^1$, thus in respect of all the words belonging to the first set; words not belonging to the first set, are characterized by the logic signal 0.

Identification of the words of the second set, namely those which exhibit at least the same 0 values as the key word, is carried out in very much the same fashion by the detection means 20 and the modulating means 30, which are associated with the comparators C0i and with the threshold generator G0.

The control generator produces a second group of N logic control signals $E_j^0$ which are this time complementary to the bits of the key word in respect of the P indicated bits, and have the value 0 in respect of the non-indicated bits. The modulating columns 30j are then transparent when they are associated with the 0 bits of the key word, and opaque when associated with the 1 bits or non-indicated bits. No zone of any of the linear detectors 20i can receive any light signal unless it is located in a column corresponding to a 0 bit of the key word; it does not in effect receive any light signal and only produces a current $i_1$ if the bit read-out has the value 1. Taking the simplified hypothesis referred to earlier in respect of any word in the second set, which only exhibits 0 values in the 0 columns of the key word, the row voltage $V_i^0$ will be zero; the threshold voltage corresponding to a word in which only one of these 0 values is replaced by a 1, will then be $V_s^0 = Ri_1$, and the threshold generator G0 can be reduced to a constant voltage. However, it will be shown at a later point that the real operation of the device requires the production of a more complex threshold voltage. This voltage $gV_s^0$ is applied to the "plus" inputs of the M comparators C0i which compare it with the row voltage $gV_i^0$ coming from the associated linear photodetector 20i applied to the "minus" input; the comparators whose "minus" inputs are supplied with a voltage $gV_i^0$ which is lower than the threshold voltage $gV_s^0$ produce a logic 1 at their output, thus characterising words which belong to the second set.

In order to be able to recognise if the word in row $i$ contains the key word, it is merely necessary to recognize whether it belongs simultaneously to the two sets, and this is something which is rendered apparent by the appearance of the logic signal 1 at the output of each of the two comparators C0i and C1i, associated with said same row $i$; this function is performed by the AND-gate Pi. The device thus makes it possible to simultaneously indicate, through the agency of a logic 1 furnished by the gates Pi, all those words in the page which contain the key word.

It has been assumed in the foregoing that it is possible to render the modulator bars perfectly opaque, on the one hand, and that a non-illuminated zone of the linear photodetector furnishes a zero current, on the other. These hypotheses, which are only roughly true, must be replaced by more realistic assumptions if a strict evaluation of the values to be given to the threshold voltages $V^0{}_S$ and $V^1{}_S$, is to be obtained.

In the following, we will designate by: $i_l$ and $i_o$ the values of the currents respectively developed in a zone of the linear detector on to which there is projected a bit of value 1 and 0 respectively, across a transparent modulator bar; $\overline{i_l}$ and $\overline{i_o}$ the values of the same currents when the modulator bar is opaque;

$P_l$ and $P_o$ the respective numbers of the bits of value 1 and 0, contained in the key word.

In the context of the recognition of the words in the first set (words having at least the same 1 values as the key word), the value which must be given to the threshold voltage is that of the row voltage which is nearest below that obtained by projecting on to one of the linear detectors belonging to the first detection means, the key word possibly supplemented by 0 values. The threshold voltage will therefore be equal to the row voltage produced by a word comprising, in the $P_1$ same columns as the 1 values of the key word (columns with transparent bars), $(P_1 - 1)$ bits of values 1 and one bit of value 0, and comprising $(N-P_1)$ bits of value 1 in the other columns (which have opaque bars), namely:

$$V_S{}^1 = R\,[(P_1-1)\,i_1 + (N-P_1)\overline{i_1}] = R\,[P_1\,(i_1-\overline{i_1}) + N\overline{i_1} - (i_l - i_o)]$$

If we put:

$$u_1 = R\,(i_1 - \overline{i_1})$$

$$V_1 = R\,[\,N\,\overline{i_1} - (i_1 - i_0)\,]$$

it will be seen that the threshold voltage $V_S{}^1$ can be placed in the form of a linear function of $P_1$:

$$V_S{}^1 = P_1 u_1 + V_1$$

Similarly, in the recognition of words of the second set, (or words having the same 0 values as the key word), the value which must be given to the threshold voltage is that which is immediately above the row voltage value obtained by projecting upon the second detection means, the key word possibly supplemented by 0 values. It will therefore be equal to the row voltage produced by a word comprising, in the $P_0$ same columns as the 0 values of the key word (columns associated with transparent bars), $(P_0-1)$ bits of value 0 and one bit of value 1, and, in the $(N-P_0)$ other columns, (associated with opaque bars), $(N-P_0)$ bits of value 0, in other words:

$$V_S{}^0 = R\,[\,(P_0-1)\,i_0 + i_1 + (N-P_0)\,\overline{i_0}\,] = R\,[\,P_0\,(i_0 - \overline{i_0}) + N\overline{i_0} + (i_1 - i_0)\,]$$

which can, if we put:

$$u_0 = R\,(i_0 - \overline{i_0})$$

$$V_0 = R\,[N\overline{i_0} + (i_1 - i_0)]$$

be written in the form of a linear function of $P_0$:

$$V_S{}^0 = P_0 u_0 + V_0$$

Under these conditions, as FIG. 3 shows, the threshold generator GO is supplied at the N inputs of the adder SO, with the second group of control signals, made up of $P_0$ logic 1 signals corresponding to the $P_0$ bits of the value 0 in the key word), and $(N-P_0)$ 0 logic signals (corresponding to the $(P-P_0)$ bits of value 1 and the $(N-M+P_0)$ non indicated bits, of the key word), picked off from the N outputs of the control generator, which go to second modulating means; the adder SO furnishes a voltage proportional to $P_0$, namely - $g\,P_0$, to the input of the multiplier MO which latter is also supplied at the first of the two supplementary inputs of the generator, with the signal: $u_0$; the multiplier thus produces the voltages $g\,P_0\,u_0$. This latter voltage is applied to one of the inputs of the second adder TO which is also supplied, from the second supplementary input of the generator, with the voltage $gV_0$ and itself produces the voltage: $g\,(P_0\,u_0 + V_0)$. This voltage is inverted by the inverter 10 which furnishes the output voltage of the threshold generator GO: $gV_s{}^0 = g\,(P_0\,u_0 + V_0)$.

In the same way, the threshold generator $G_1$ is supplied at N inputs with the first group of N control signals coming from the N first outputs of the control generator; this group comprises $P_1$ 1 signals, associated with the $P_1$ bits of value 1 in the key word, and with $(N-P_1)$ 0 signals associated with the bits of value 0 or non-indicated bits, in the key word. At the first supplementary input, the threshold generator G1 is furthermore supplied with the voltage $u_1$; at the second supplementary input it receives the voltage $gV_1$. Thus, its output produces $gV_S = g(P_1 u_1 + V_1)$.

The existence of currents other than zero, $\overline{i_1}$, $i_0$ and $\overline{i_0}$ not only modifies the values of the threshold voltages, as has been seen before, but also imposes a limitation upon the operation of the device.

To point up the nature of this limitation, let us consider for example the first detection means associated with the recognition of words having the same 1 values as the key word, in the situation where said key word contains no 1 bit; all the modulation columns are then opaque and the row voltage produced for a word identical to the key word is:

$$(V_l{}^1)_m = RN\overline{i_o}$$

Under these conditions, the threshold generator $G_1$ furnishes the threshold voltage:

$$(V_S{}^1)_m = R\,[N i_1 - (i_1 - i_0)\,]$$

and in order for the identification system to operate even in this limiting case, the condition:

$$(V_l{}^1)_m > (V_S{}^1)_m$$

must be satisfied, which imposes a limiting value upon the number N of bits forming the words to be recognised, namely $$N < \frac{i_1 - i_o}{i_1 - \overline{i_o}}$$

In the case where the photodetectors supply a current $i$ which varies linearly as a function of the received illumination, it is possible, calling $j$ the dark current and using the references $e_1$, $e_0$ and $t_1$, $t_0$ respectively to designate the illumination levels received by the zones and the transmission factors of the modulating columns for the logic values 1 and 0, to put: $i_1 = j + at_1e_1$; $\overline{i_1} = j + a\ t_0e_1$ $i_0 = j\ a\ t_1\ e_0$ and $\overline{i_0} = j + a\ t_0e_0$.

The limiting value of N then takes the vary simple form:

$$N < \frac{1}{t_0}$$

By way of an example of application of this system taking a store plane having a side length of 30mm and containing 1024 holograms recorded in such a fashion that each of them, illuminated by the laser beam, reconstitutes at a distance of 600mm, an image of the store page 30mm in side length and containing 32 words of 32 bits each, it is possible to record in each store plane around $10^6$ bits; the modulator bars should then, in the opaque state, have a transmission factor which is about 50 times less than that which they present in the transparent state.

SECOND EMBODIMENT

The invention also proposes a second embodiment of the device, designed to implement the process described initially, which embodiment makes it possible to overcome the limitation imposed by the transparency of the modulating bars.

In this second embodiment, the overall disposition of the store plane 10, the separating plate 12 and the detection means 20 and 21, as shown in FIG. 2, is retained, as also are the links between the control generator 4 and the modulating means 30 and 31, on the one hand, and those between the detection means 20 and 21 and the logic processing means 5, on the other. However, it should be understood that the modulating means 30 and 31, which have been shown in planes distinct from those containing the detection means 20 and 21, are then located either in the same planes 120 and 121 as said latter, or behind said planes.

Figure 4:
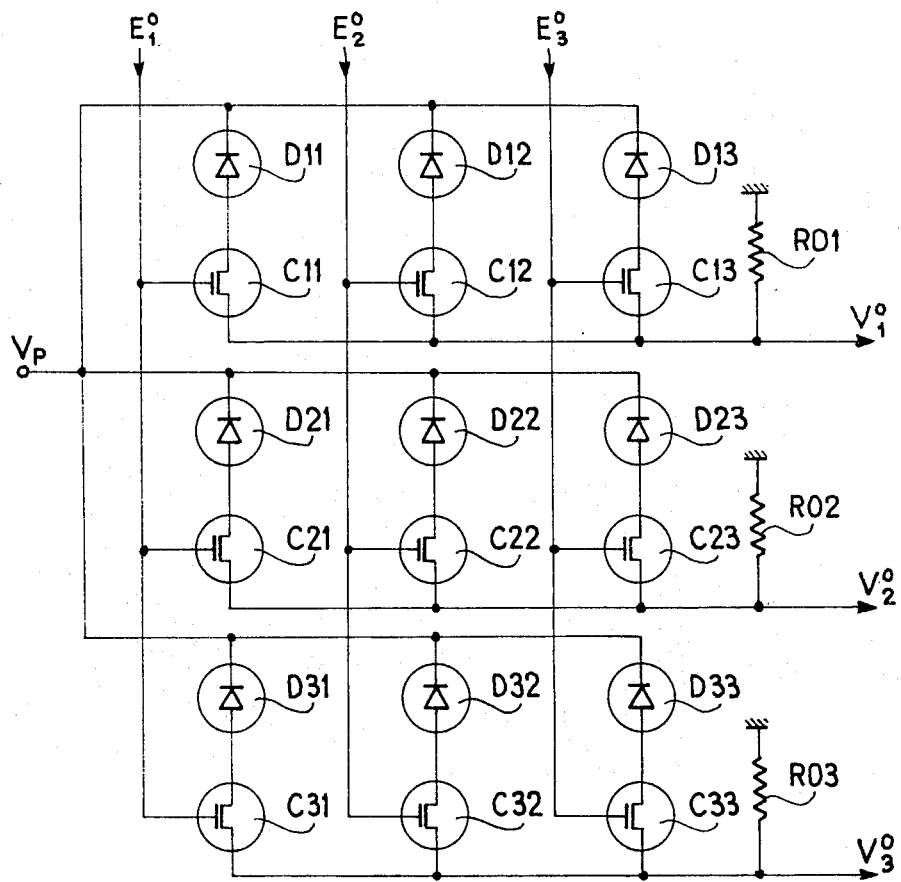
FIG. 4 illustrates a second embodiment of the device in accordance with the invention.

FIG. 4 describes the relative arrangement of the detection means 20 (or 21) and the modulating means 30 (or 31), within the context of the second embodiment of the device. In order to simplify the connection diagram, the detection and modulating means have been illustrated as being disposed in one and the same plane 120 (or 121), which is the plane on to which there is projected one of the two images of the store page; the same connecting diagram can be produced by arranging the modulating means behind (considered in relation to the direction of propagation of the light rays) the plane which contains the detection means.

As FIG. 4 shows, the detection means 20 (or 21) are constituted by a regular array of M rows each containing N separate photodetectors $D_{ij}$, each photodetector receiving one bit of the image. The modulating means 30 (or 31) are constituted by a regular array of N columns each comprising M analogue gates $C_{ij}$.

Each photodetector $D_{ij}$ of the array 20 (or 21) is connected in series with an analogue gate $C_{ij}$ of the array 30 (or 31), between a bias voltage $V_p$ which is common to all the photodetectors, and a collector line common to all the photodetectors of one and the same row of order i, each collector line itself being earthed across a resistor R. Each gate $C_{ij}$ has a control input designed to be supplied with a control voltage $E_j$ common to all the gates of one and the same column of order $j$; the N control voltages $E_j^0$ relating to the modulating means 30, like the N control voltages $E_j^1$ relating to the modulating means 31, are supplied by the control generator 4 in the same form as in the first embodiment.

The analogue gates $C_{ij}$ operate as contact breakers and modulate the current produced by the associated detectors as a function of the control voltage $E_j$ applied to them. When the control voltage $E_j$ applied to all the gates $C_{ij}$ of the column of order $j$, has the logic value 1, these gates behave as resistors of low resistance in series between the associated photodetector and their collecting line; each photodetectors of the column then produces a current which has the value $l$ when it receives the light signal corresponding to the bit of value 1 and the value $_o$ in the absence of any light signal, that is to say in respect of bits of value 0. When the control voltage $E_j$ has the logic value 0, the gate has a sufficiently high resistance for the currents $\overline{i_1}$ furnished by the photodetectors which receive a bit of value 1, and those $\overline{i_0}$ furnished by the photodetectors which receive a bit of value 0, to be considered as zero. The current furnished by the collecting line is the sum of the individual currents produced by the photodectors; at the input of the resistor R, it generates the row voltage $V_i^0$ (ou $V_i^1$).

If the first and second embodiments are, then it will be seen that:

on the one hand the modulating columns, formed by variable transparency bars acting upstream of the photodetectors in order to modulate the luminous intensity received by these latter, have been replaced by modulating columns formed by variable-resistance gates acting downstream of the photodetectors in order to modulate the current produced;

on the other hand, the lines constituting the detection means and formed by linear photodetectors, have been replaced by a linear mosaic of separate photodetectors.

This apart, the operation of the combination of detection means and modulation means is the same in both embodiments, and the latter can therefore utilise similar optical projection means, a similar control generator and similar logic processing means for handling the row currents. By contrast, because of the fact that the currents $\overline{i_1}$ and $\overline{i_0}$ can be considered as zero, the limitation imposed by the maximum number of bits contained in each word, is overcome and the threshold voltages acquire simpler values so that in other words we have.

| | |
|---|---|
| $u_0 = Ri_0$ | $V_0 = R(i_1 - i_0)$ |
| $u_1 = Ri_1$ | $V_1 = R(i_1 - i_0)$ |

The device in accordance with the invention, in both its first and its second embodiment, has been described in relation to the case where the projected store page is stored in the form of a hologram belonging to a holographic store plane. The foregoing clearly shows that the operation of this device in no way depends upon the form in which the store is filled provided that the projected page appears in the form of uniformly disposed light spots.

What I claim is:

1. A method of recognizing words for an associative store for simultaneously identifying, in a store page containing M stored words of N bits, arranged in a single regular array of M rows and N columns, all the words comprising P bits identical in value and position, to P bits forming a key word (P being at the most equal to N); said method comprising simultaneously generating a first and a second row signal for characterizing each said stored word; said first and second row signals being linear functions of the number of 1 of said stored word arranged in the same column as respectively the 1 and the 0 of said key word; and utilizing said first and second row signals for simultaneously grouping, respectively in a first and a second set, all the words exhibiting at least the same 1 values and at least the same 0 values as said key word; the identified words being those simultaneously belonging to said first and second sets.

2. A method according to claim 1, comprising the following steps:
   a. associating a first and a second logic signal to each of said bits arranged in the same columns as respectively the bits 1 and the bits 0 of said key word;
   b. summing respectively said first and said second logic signals associated to said bits of a same said stored word for forming said first and said second row signal;
   c. generating a first and a second threshold signal from said key word; said first and second threshold signals being predetermined linear functions of the number of bits respectively 1 and 0 contained in said key word;
   d. simultaneously comparing each of said first and each of said second row signals respectively to said first and to said second threshold signal for selecting those of said stored words respectively pertaining to said first and said second set.

3. A method according to claim 2, wherein, the value of said first and second logic signals associated to the bits 1 being greater than the value associated to the bits 0, said stored words having a said first row signal greater than said first threshold signal pertain to said first set and said stored words having a said second row signal smaller than said second threshold signal pertain to said second set.

4. A method according to claim 1, wherein said associative store is an associative optical store, said method further comprising the step of projecting two simultaneous identical images of said page onto first and second detection means for respectively providing said first and second row signals.

5. A words identification device for an associative optical store, for simultaneously identifying, in a store page containing M words of N bits arranged in a regular array of M rows and N columns, all the words comprising P bits identical in value and in position to P bits forming a key word (P being at the most equal to N ), which includes:
   a control generator having N inputs for receiving said P bits of said key word and N first and N second outputs for respectively delivering a first and a second set of control signals, each said set comprising N electrical logic control signals and being characteristic of said key word;
   optical projection means for simultaneously projecting a first and a second image of said store page; said first and second images being identical and made of light spots; said light spots occupying part of the intersections in a regular array of M rows and N columns, each intersection corresponding to one of said bits and each light spot indicating a bit 1;
   first and second detection means arranged for respectively receiving said first and second images and respectively comprising M detection rows, each of said detection row supplying a row voltage;
   first and second modulator means for modulating said row voltages under the control of respectively said first and second sets of control signals; said first and second modulator means being respectively controlled by said first and second sets of control signals and respectively comprising N modulating columns; each said modulating column being perpendicular to said detection rows and controlled by one of said logic control signals; and
   electrical processing means for processing said row voltages.

6. A device according to claim 5, wherein said first and said second set of control signals respectively comprise P logic control signals having the same logic value as said P bits of said key word and P logic control signals having the complemented values of said P bits of said key word, both first and second sets also comprising (N − P) logic control signals having the logic value 0.

7. A device according to claim 6, wherein a same modulating column delimiting a detection zone in each said detection row, each said detection zone is associated with one said bit in said image and supplies a zone current, said zone current depending upon the value of said bit and of said logic control signal controlling said modulating column; each said row voltage being respectively proportional to the sum of said zone currents applied by said detection zones pertaining to a same said row.

8. A device according to claim 7 wherein, amongst said detection zones delimited by said modulating columns controlled by said logic control signals of logic value 1, said detection zones associated with a bit 1 supply a zone current larger than the zone current supplied by the detection zones associated with bits 0.

9. A device according to claim 8 wherein the difference between the two zones currents supplied by two said detection zones respectively associated with bits 1 and 0 varies in a ratio greater than N when the logic value of said logic control signal, simultaneously applied to said modulating columns delimiting the two said zones, changes from 1 to 0.

10. A device according to claim 9, wherein said electrical processing means include:
    a first and a second threshold generator for respectively producing a first and a second threshold voltage;
    M first and M second comparator means for respectively comparing the M said row voltages supplied by said first detection means to said first threshold voltage, and the M said row voltages supplied by said second detection means to said second threshold voltage and for respectively delivering M first and M second logic comparison signals; and
    M AND-gates, each AND-gate having two inputs for respectively receiving one said first and one said second logic comparaison signal and one output for delivering a logic identification signal; said identification signal being associated with one stored word of said page.

11. A device according to claim 10, wherein said first and second threshold generators each comprise:

N inputs for respectively receiving said first an said second set of control signals, and a first and second supplementary inputs for respectively receiving a first and a second constant voltage;
a first adder for receiving said set of control signals and delivering the sum of said logic control signals;
a multiplier for delivering the product of said sum by said first constant voltage; and
a second adder for summing said product and said second constant voltage.

12. A device according to claim 9, wherein said first and second modulating means are respectively arranged between said optical projection means and said first and second detection means, for modulating the intensity of said light spots forming said images.

13. A device according to claim 12, wherein said modulating columns are respectively constituted by a bar of electro-optical material, said bars being coated with transparent electrodes on the two parallel faces which are crossed by the light.

14. A device according to claim 13, wherein said detection rows are respectively constituted by a single linear photodetector.

15. A device according to claim 9, wherein:
said detection rows are respectively constituted by N separate photodetectors each photodetector forming said detection zone and said N photodetectors being connected in parallel to a common collecting line;
said modulating columns being respectively constituted by M analogue gates; each said gate of a same said modulating column being controlled by said logic control signal applied to said modulating column and being connected in series between one said photodetector and said common line for modulating said zone current under the control of said logic control signal.

16. A device according to claim 5, wherein said optical projectin means comprise:
a store plane including a regular array of holograms, each of said holograms being the hologram of one said store page;
a coherent light beam for selectively illuminating one of said holograms, and projecting on primary image of said store page;
and a separating plate for providing, from said primary image, said first and second images.

* * * * *